(12) United States Patent
Iwatsuki

(10) Patent No.: US 6,571,087 B1
(45) Date of Patent: May 27, 2003

(54) RADIO TRANSMITTER APPARATUS

(75) Inventor: Masanori Iwatsuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/405,710

(22) Filed: Sep. 24, 1999

(30) Foreign Application Priority Data

Sep. 24, 1998 (JP) .......................................... 10-270021

(51) Int. Cl.⁷ ................................................ H04B 1/02
(52) U.S. Cl. ...................................... 455/127; 455/115
(58) Field of Search .............................. 455/126, 127, 455/115; 330/278, 279; 333/111

(56) References Cited

U.S. PATENT DOCUMENTS

| | | | |
|---|---|---|---|
| 5,363,071 A | * 11/1994 | Schwent et al. ............ | 333/111 |
| 5,392,464 A | * 2/1995 | Pakonen ..................... | 455/115 |
| 5,446,920 A | * 8/1995 | Matsumoto et al. ........ | 455/126 |
| 5,937,336 A | * 8/1999 | Kumagai .................... | 455/126 |

FOREIGN PATENT DOCUMENTS

| | | |
|---|---|---|
| JP | 60-31323 | 2/1985 |
| JP | 62-232222 | 10/1987 |
| JP | 4-44433 | 2/1992 |
| JP | 10-65472 | 3/1998 |

* cited by examiner

Primary Examiner—William Trost
Assistant Examiner—Philip J. Sobutka
(74) Attorney, Agent, or Firm—Katten Muchin Zavis Rosenman

(57) ABSTRACT

A radio transmitter apparatus performing an ALC operation by selecting either of a high power mode and a low power mode and capable of further increasing a level difference of transmission power levels in the modes while supplying a stable detection voltage to an ALC circuit without destruction of a detection diode, including a transmission power generating stage, a detection unit, an ALC circuit performing automatic level control, and an ATPC unit performing automatic power control for operation in either of the high power mode or the low power mode, the detection unit configured by a first detection unit which becomes effective in the low power mode and a second detection unit which becomes effective in the high power mode.

9 Claims, 15 Drawing Sheets

RADIO TRANSMITTER APPARATUS

BACKGROUND OF THE INVENTION

1. Field of the Invention

The present invention relates to a radio transmitter apparatus, more particularly relates to an automatic level control circuit (hereinafter also referred to as an ALC circuit) in a radio transmitter apparatus having an automatic power control (hereinafter also referred to as an ATPC) function and, in more detail, relates to a detection unit in an ALC circuit In a radio transmitter apparatus, an ALC circuit is generally provided in order to hold an output power at a predetermined constant level. Namely, a detection stage forming part of the ALC circuit detects a transmitting output level from the radio transmitter apparatus as a voltage and applies feedback so as to change the gain at a transmission power generating stage in the radio transmitter apparatus according to the change in level of the detected voltage. In order to change the gain, usually an attenuation amount or gain of a variable attenuator or a variable gain amplifier constituting part of the transmission power generating stage is controlled.

A radio-transmitter apparatus provided with such an ALC circuit, however, is further being given the above ATPC function. The role of this ATPC function is as follows.

For example, when transmitting and receiving radio frequency (RF) signals between one repeater office and another repeater office via antennas of the offices, the radio system is ordinarily designed so that stable transmission and reception of the radio frequency signal are maintained even when the communications conditions become the worst due to the meteorological conditions or topological conditions between these two repeater offices.

However, the probability of the communications conditions becoming the worst due to rain, snow, fading, etc. is very low. Experience has taught that good communications conditions are secured in most hours. Nevertheless, radio systems are being designed assuming the radio signals are transmitted and received under the worst communications conditions. For this reason, the radio transmitter apparatus consumes more than the necessary electric power in most hours. This is becoming a constant obstacle in satisfying demands for a reduction of the power consumption of the radio transmitter apparatus and a reduction of the size of the apparatus. A large power consumption means that a high density packaging cannot be achieved in the apparatus. This is because the heat cannot be sufficiently dissipated with such high density packaging. Accordingly, high density packaging is not possible, that is, the size cannot be reduced.

The ATPC function has been proposed and put into practical use in order to deal with this problem. For this, the transmission power generating stage in the radio transmitter apparatus is made able to operate in either of a high power mode or a low power mode. Due to this, the radio transmitter apparatus is made able to be operated in the low power mode in most hours during which good communications conditions are secured and is selectively operated in the high power mode for only the few hours during which the communications conditions become the worst. Thus, the above problem is solved by this APTC function.

The present invention relates to a radio transmitter apparatus provided with the above ATPC function in addition to the general ALC circuit.

2. Description of the Related Art

In a radio transmitter apparatus, the effect of ATPC by an ATPC unit is exhibited when the transmission power level in the low power mode has become sufficiently low. This is because, as already mentioned, the aim of ATPC is the reduction of the power consumption by taking note of the fact that good communications conditions are secured in most hours. This being so, it can be said that, when the transmission power level in the low power mode is sufficiently low compared with the transmission power level in the high power mode, that is, the larger a level difference between the transmission power levels in the high power mode and the low power mode, the larger the effect by ATPC.

However, even if it is attempted to set the level difference large, in actuality, not so large a level difference can be realized. This will be explained in detail later. Note that the detector forming one of the principal components of a radio transmitter apparatus is usually comprised of a Schottky diode.

In order to increase the effect of the ATPC described above, where the above level difference is increased from $\Delta p$ to $\Delta P$, as already mentioned, inevitably, also the dynamic range is increased from d to D.

When the level difference is increased to the above $\Delta P$ for example, however, it enters a nonlinear region of characteristics in a first active region and the detection sensitivity of the detection voltage becomes bad. For this reason, the required stable ALC function ends up no longer being achieved.

On the other hand, in a second active region, an excess input is applied to the Schottky diode and the diode is liable to be destroyed.

In this way, there is a problem that, even if it is desired to increase the level difference $\Delta p$ to $\Delta P$, in actuality, there is the above constraint of the dynamic range, therefore it cannot be realized.

SUMMARY OF THE INVENTION

Accordingly, in consideration with the above problem, an object of the present invention is to provide a radio transmitter apparatus enabling the increase of the level difference without the danger of the destruction of the Schottky diode and while maintaining a stable ALC function.

To attain the above object, according to the present invention, there is provided a radio transmitter apparatus including a transmission power generating stage (11), a detection unit (13), an ALC circuit (16) performing automatic level control, and an ATPC unit (17) performing automatic power control for operation in either of a high power mode or a low power mode, wherein the detection unit (13) is configured by a first detection unit (13L) which becomes effective in the low power mode and a second detection unit (13H) which becomes effective in the high power mode.

Thus, by the ATPC function, a radio transmitter apparatus performing an ALC operation by selecting either of the high power mode and the low power mode and capable of further increasing the level difference of the transmission power levels in different modes while supplying a stable detection voltage to an ALC circuit without destruction of a detection diode is realized.

BRIEF DESCRIPTION OF THE DRAWINGS

The above object and features of the present invention will be more apparent from the following description of the preferred embodiments with reference to the accompanying drawings, wherein.

DESCRIPTION OF THE PREFERRED EMBODIMENTS

Before describing the embodiments of the present invention, the related art and the disadvantages therein will be described with reference to the related figures.

Figure 17:
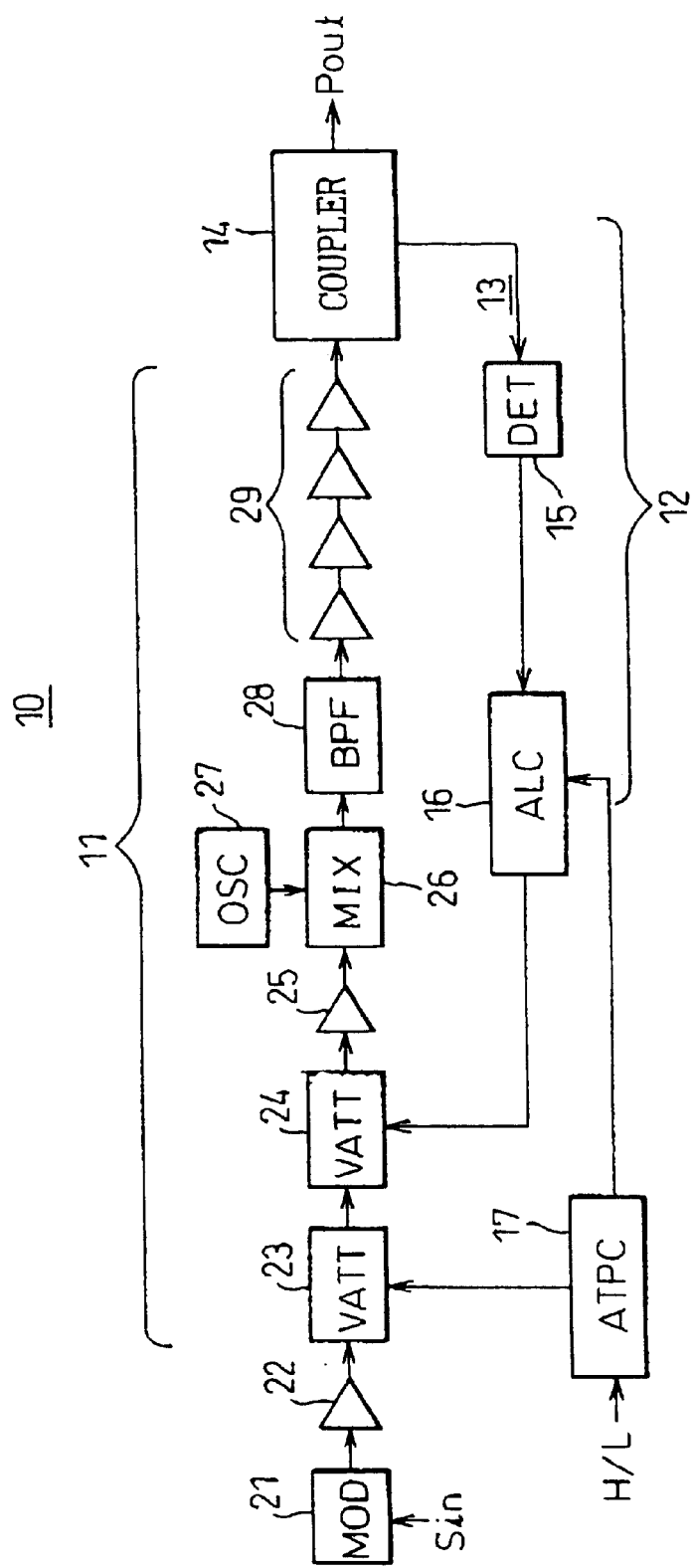
FIG. 17 is a view of an example of a radio transmitter apparatus of the related art.

FIG. 17 is a view of an example of a radio transmitter apparatus of the related art. Particularly, it shows an example of a high frequency part of a radio transmitter apparatus provided with an ATPC function in addition to a general ALC circuit.

In FIG. 17, a radio transmitter apparatus 10 is mainly configured by a transmission power generating stage 11 which receives an input signal $S_{in}$ and performs frequency conversion and power amplification, an ALC stage 12 which forms a feedback loop with respect to this generating stage 11 and performs ALC, a detection unit 13 forming a path from the generating stage 11 to the ALC stage 12, and an ATPC unit 17 operating the generating stage 11 and the ALC stage 12 in either of the high power mode or the low power mode. In further detail, it is configured as follows.

A modulator (MOD) 21 receiving the input signal $S_{in}$ outputs an IF signal. This IF signal is amplified at an IF band amplifier 22 and then set at a predetermined level by a variable attenuator (VATT) 23. This variable attenuator 23 functions to lower the transmission power level by making the amount of attenuation of this attenuator 23 large when information H/L indicating a reception level of a received radio frequency signal at an office at which this apparatus 10 is mounted indicates a certain high level (H).

The IF signal further passes through an ALC use variable attenuator (VATT) 24, is further amplified at the IF band amplifier 25, and then is input to a frequency converter (MIX) 26. At this frequency converter 26, the IF signal and a local signal from a local oscillator (OSC) 27 are mixed and the IF signal is converted to an RF signal. An unnecessary signal of the RF signal output from the frequency converter 26 is eliminated at a band pass filter (BPF) 28, then the RF signal is amplified up to a required transmission power level at an RF band amplifier group 29.

One part of the amplified RF signal from the amplifier group 29 is input to the detection unit 13. Namely, one part of the RF signal is taken out at a coupler 14 forming the detection unit 13 and further detected at a detector (DET) 15 also forming the detection unit 13. Thus, a detection voltage corresponding to the transmission power level is obtained from the detector 15.

The detection voltage is input to an ALC circuit 16 which controls the variable attenuator 24. Namely, control is performed so that the transmission power level becomes constant by making the detection voltage constant. In this case, the transmission output generating stage 11 and the ALC stage 12 operate in the high power mode or the low power mode according to the information H/L from the ATPC unit 17. Note that, at the time of operation in this low power mode, a power circuit (not illustrated) is set so that the DC power input to the RF band amplifier group 29 becomes small, that is, the power consumption of the radio transmitter apparatus 10 becomes small.

In the radio transmitter apparatus 10 shown in FIG. 17, the effect of ATPC by the ATPC unit 17 is exhibited when the transmission power level in the low power mode has become sufficiently low. This is because, as already mentioned, the aim of ATPC is the reduction of the power consumption by taking note of the fact that good communications conditions are secured at most hours. It can be said that, when the transmission power level in the low power mode is sufficiently low compared with the transmission power level in the high power mode (output level of the RF band amplifier group 29), that is, the larger the level difference between the transmission power levels in the high power mode and the low power mode, the larger the effect of the ATPC.

However, even if it is attempted to set the level difference large, in actuality, not so great a level difference can be realized. This is the problem. This will be explained in further detail next.

Here, looking at the detector 15 in the detection unit 13 of FIG. 17, this detector 15 is usually comprised of a Schottky diode.

Figure 18:
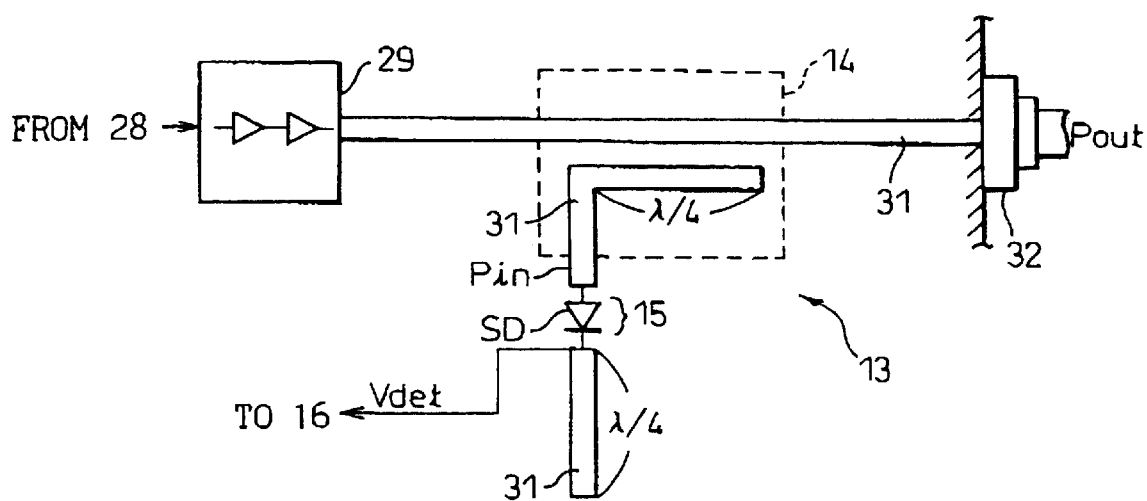
FIG. 18 is a view of the concrete configuration of the detection unit 13 shown in FIG. 17.

FIG. 18 is a view of the concrete configuration of the detection unit 13 shown in FIG. 17. A Schottky diode SD is adopted as the detector 15 forming part of the detection unit 13 of FIG. 18.

In FIG. 18, reference numeral 31 is a microstrip line. One part thereof constitutes a coupler 14. The output is taken out as an intended transmission power $P_{out}$ via a connector 32 and led to a transmission antenna (not illustrated).

On the other hand, part of the transmission output $P_{out}$ is taken out from the coupler 14 and applied as the input power $P_{in}$ to the detector 15 comprising the Schottky diode SD. A detection voltage $V_{det}$ proportional to the input power $P_{in}$ is obtained and applied to the ALC circuit 16.

Figure 19A:
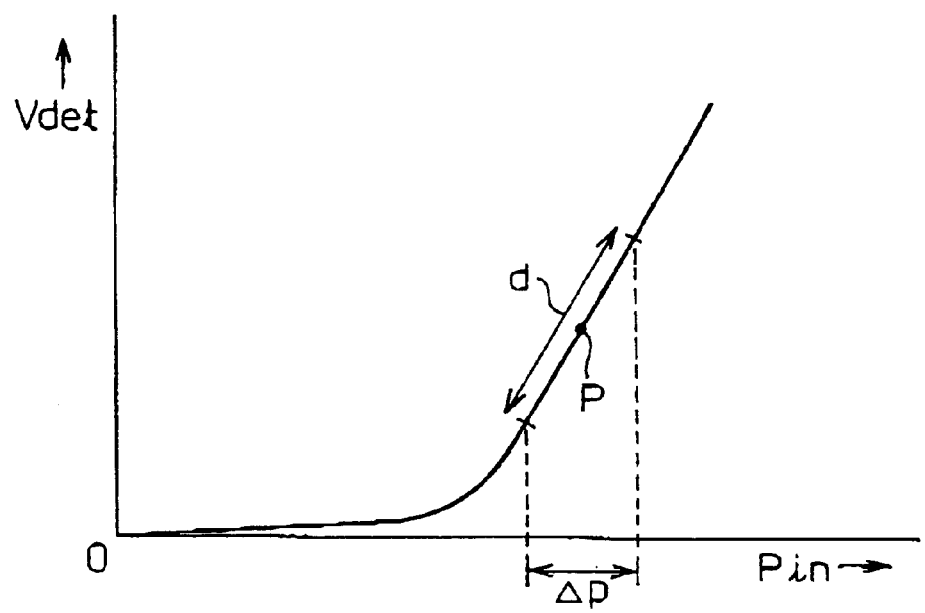
FIGS. 19A and 19B are graphs for explaining problems derived from the $P_{in}$-$V_{det}$ characteristic of a Schottky diode.
Figure 19B:
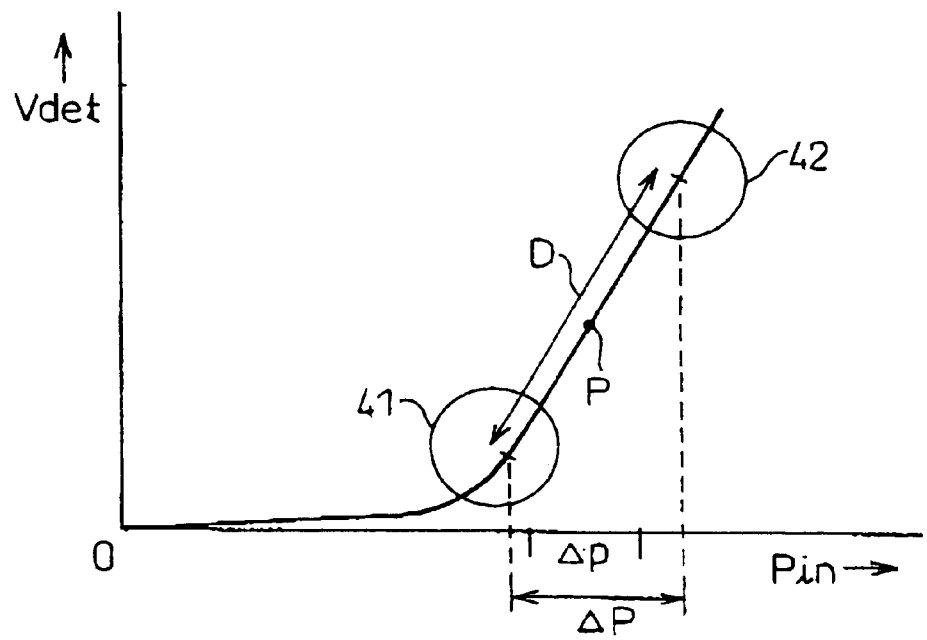

FIGS. 19A and 19B are graphs for explaining the problem derived from the $P_{in}$-$V_{det}$ characteristic of the Schottky diode. That is, the graphs of FIGS. 19A and 19B show the characteristic of the input power ($P_{in}$) versus the detection voltage ($V_{det}$) of the Schottky diode SD. FIG. 19A shows a usual dynamic range d. The level difference between transmission power ($P_{out}$) levels in the high power mode and low power mode at this time and accordingly the level difference $\Delta p$ of $P_{in}$ is relatively small. Note that, P in the figure represents the optimum working point.

On the other hand, the graph of FIG. 19B shows the case where the level difference is increased from $\Delta p$ to $\Delta P$ in order to increase the effect of ATPC as already mentioned. In this case, inevitably, the dynamic range is also increased from d to D.

However, as seen from the graph of FIG. 19B, when the level difference is increased like $\Delta P$, it enters the nonlinear region of characteristics in an active region 41, and the detection sensitivity of the detection voltage becomes bad. For this reason, the required stable ALC function ends up no longer being achieved.

On the other hand, in an active region 42, an excess input is liable to be applied to the Schottky diode SD and destroy it.

In this way, there is the already mentioned problem that even if it is desired to increase the level difference $\Delta p$ to $\Delta P$, in actuality there is the constraint of the dynamic range mentioned above, therefore it cannot be realized.

Accordingly, the present invention provides a radio transmitter apparatus enabling the increase of the level difference without the danger of the destruction of the Schottky diode and while maintaining a stable ALC function.

Figure 1:
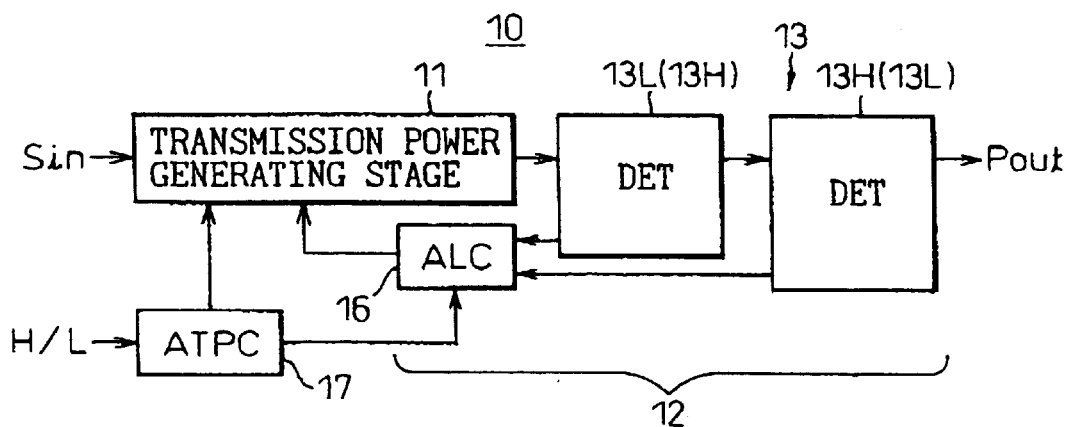
FIG. 1 is a view of the basic configuration of a radio transmitter apparatus based on the present invention.

FIG. 1 is a view of the basic configuration of a radio transmitter apparatus based on the present invention. Note that, the same reference numerals or symbols are attached to similar components throughout all of the figures.

In FIG. 1, the radio transmitter apparatus 10 according to the present invention basically includes a transmission power generating stage 11 performing frequency conversion on, amplifying, and outputting the input signal $S_{in}$, a detection unit 13 partially branching the output of this transmission power generating stage 11 and outputting the detection voltage, an ALC circuit 16 performing automatic level control (ALC) with respect to the transmission power generating stage 11 according to the detection output from this detection unit 13, and an ATPC unit 17 performing automatic power control (ATPC) for operating the transmission power generating stage 11 and the ALC circuit 16 in either of the high power mode or the low power mode.

Here, the characteristic feature of the present invention resides in the point that the detection unit 13 is configured by:

(i) a first detection unit (DET) 13L which becomes effective in the low power mode and
(ii) a second detection unit 13H which becomes effective in the high power mode.

Figure 2:
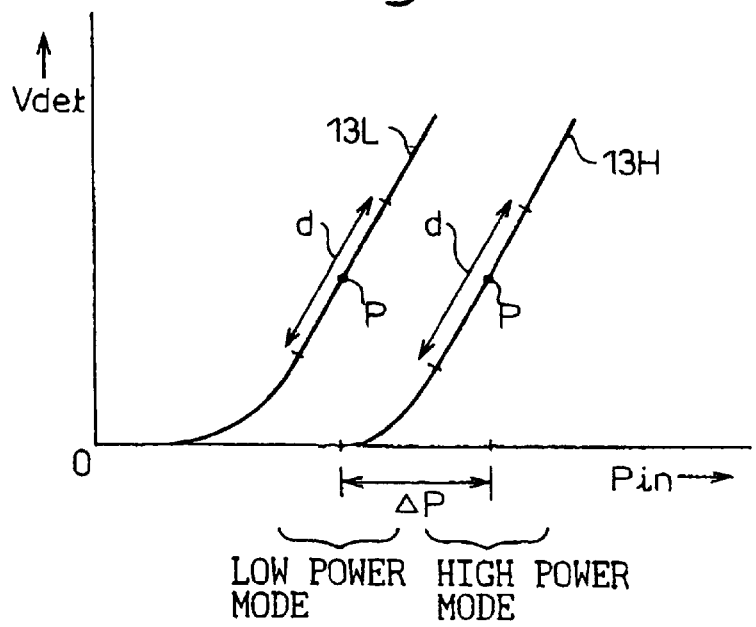
FIG. 2 is a graph of the $P_{in}$-$V_{det}$ characteristic in a detection unit 13 shown in FIG. 1.

FIG. 2 is a graph of the $P_{in}$-$V_{det}$ characteristic in the detection unit 13 in FIG. 1. This graph corresponds to the graph of FIGS. 19A and 19B. As diagrammatically represented in FIG. 2, a large level difference $\Delta P$ as shown in FIG. 19B can be secured, although the detection unit 13 is operated in the proper dynamic range d as shown in FIG. 19A.

Due to this, as already mentioned, the danger of destruction of the Schottky diode SD disappears, a stable ALC function can be always maintained, and the effect of the reduction of the power consumption by ATPC is sufficiently exhibited. For this reason, there is the advantage that a reduction of the size of the radio transmitter apparatus can be achieved.

Figure 3:
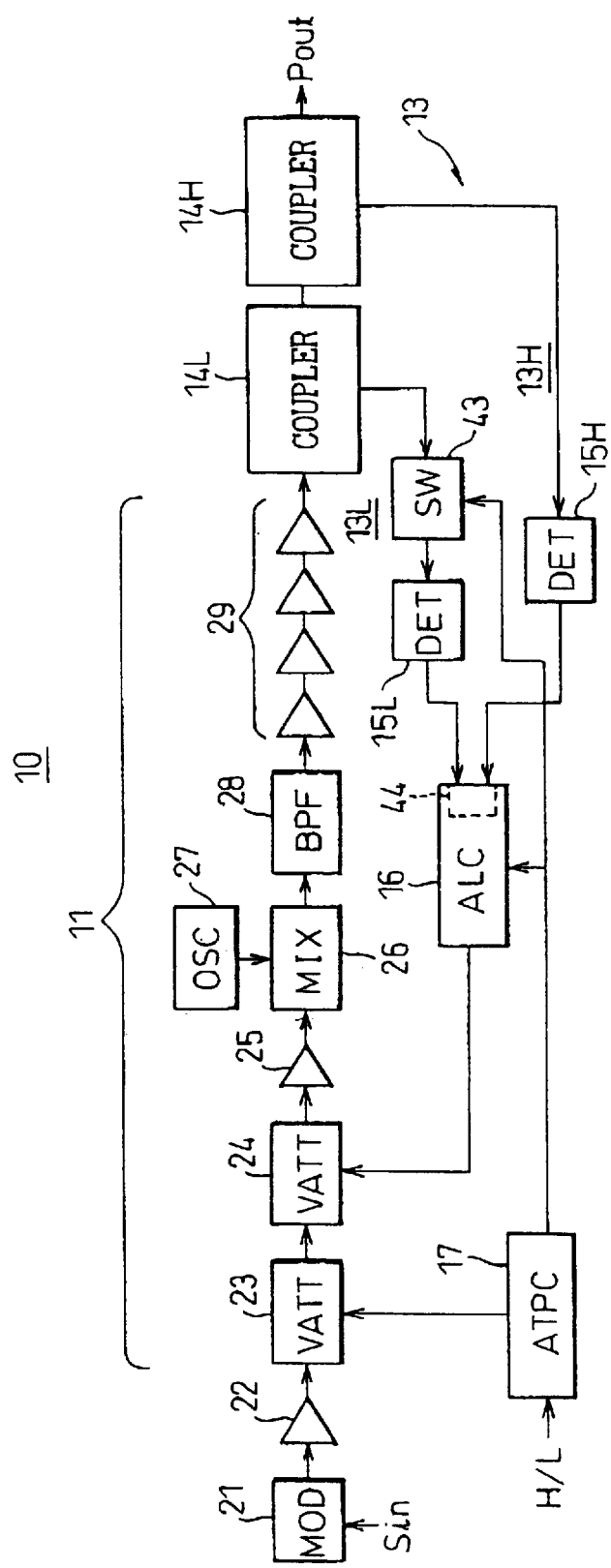
FIG. 3 is a view of a first embodiment based on the present invention.

FIG. 3 is a view of a first embodiment based on the present invention.

The first detection unit 13L comprises a closely coupled first coupler 14L and first detector 15L. Further, the second detection unit 13H comprises a loosely coupled second coupler 14H and second detector 15H.

Further, the first detection unit 13L is provided with a switch (SW) 43 which turns OFF in the high power mode on an input side of the first detector 15L.

In order to obtain the detection voltage $V_{det}$ required for the ALC operation in the low power mode, it is necessary to make the degree of coupling of the coupler 14L high and input a suitable RF signal to the detector 15L. In the present embodiment, when the transmission power is set at a high level (high power mode), the switch 43 is turned OFF by the setting information H/L from the ATPC unit 17 (or ALC circuit 16), so that an excessive RF signal is not input to the low power mode detector 15L and destruction of the low power mode diode SD is prevented in the high power mode.

In the above operation, when the switch 43 is ON, that is, in the high power mode, the detection voltage from the second detection unit 13H side is input to the ALC circuit 16. However, this detection voltage is induced by the input power from the close coupled coupler 14H and is a fine voltage, so has a small influence with respect to the ALC circuit 16.

If it is intended to completely eliminate this influence, a selector 44 may be provided on the input side of the ALC circuit 16 to make it possible to only alternatively fetch the outputs from the detectors 15L and 15H. This selector 44 can be configured by an analog switch.

Next, a concrete example will be given for the principal circuit elements in the embodiment of FIG. 3.

Figure 4:
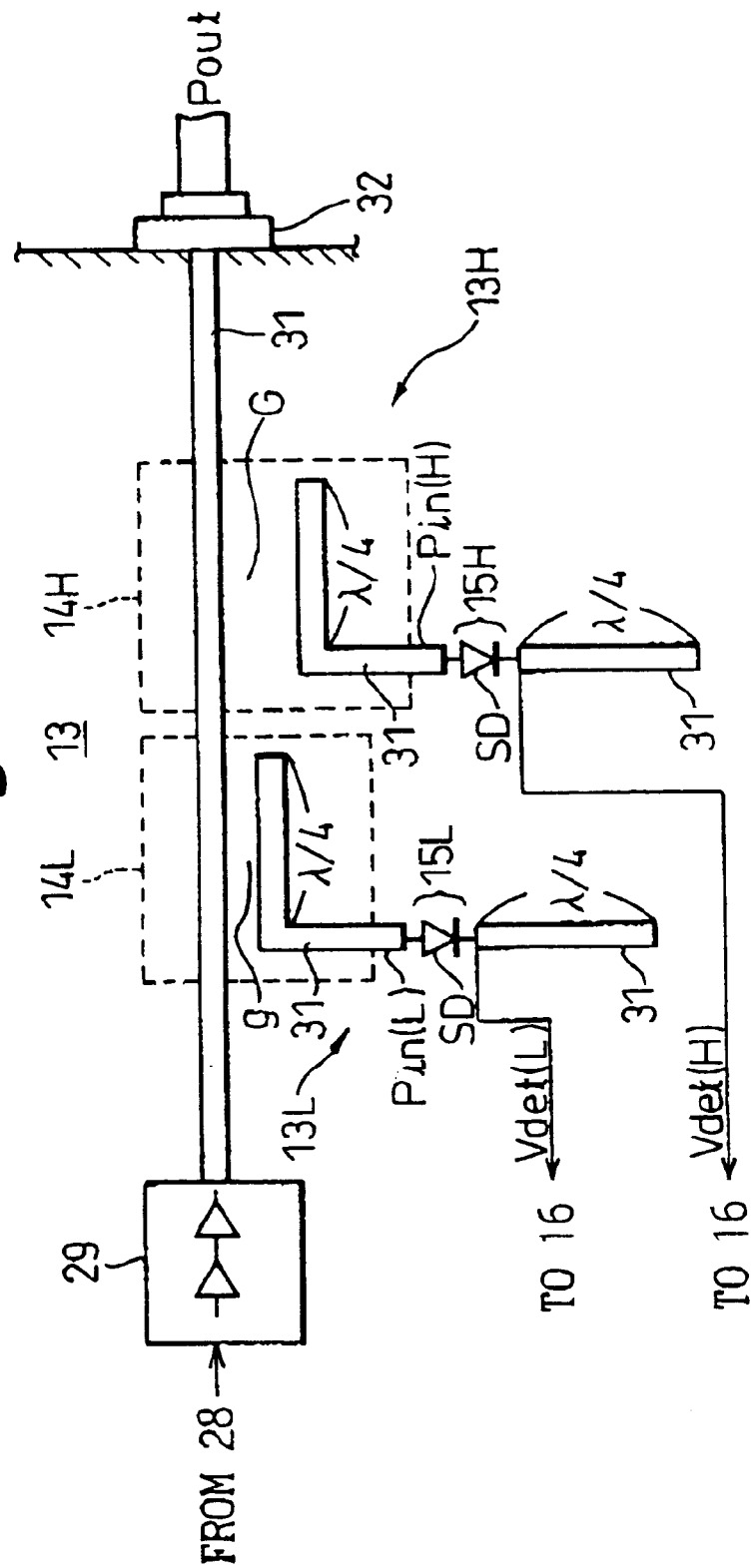
FIG. 4 is a view of a concrete example of the detection unit 13 shown in FIG. 3.

FIG. 4 is a view of a concrete example of the detection unit 13 in FIG. 3. Note that the switch 43 is omitted here. In the present figure, the difference of the configurations of the closely coupled coupler 14L and the loosely coupled coupler 14H is clearly shown. Namely, the gaps with respect to the microstrip line 31 distributed from the output of the RF band amplifier group 29 to the connector 32 are different as indicated by g and G.

Figure 5:
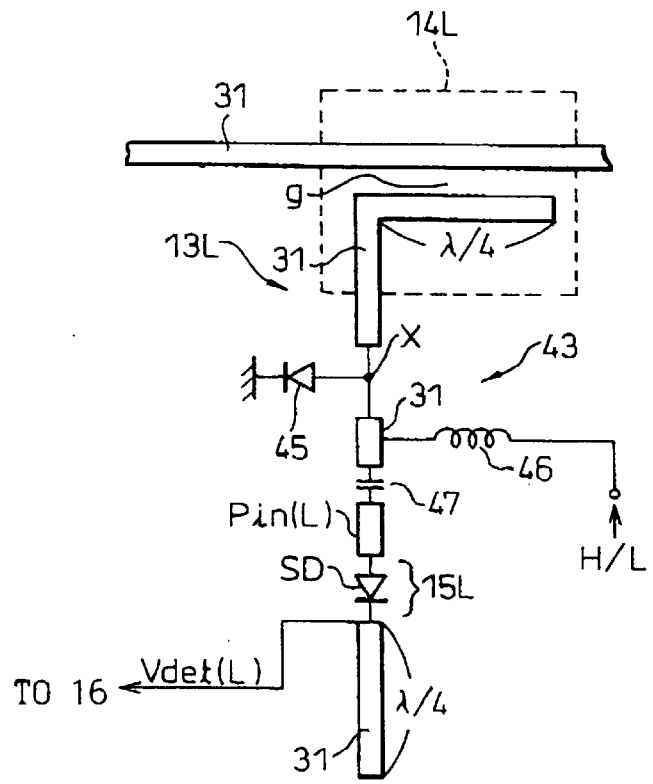
FIG. 5 is a view of a concrete example of a switch 43 of FIG. 3.

FIG. 5 is a view of a concrete example of the switch 43 of FIG. 3. This shows a state where the switch 43 is inserted into the detection unit 13L of FIG. 4.

As illustrated, the switch 43 comprises a PIN diode 45, a choke coil 46, and a DC-cut capacitor 47. One end of the choke coil 46 is connected to the microstrip line 31. A control signal corresponding to the setting information H/L is input to the other end thereof.

In the low power mode, the control signal L (low) is input to the other end of the choke coil 46, and the PIN diode 45 becomes OFF. For this reason, the signal from the coupler 14L passes through a point "X", and the detection voltage $V_{det}$ (L) is obtained from the diode SD.

On the other hand, in the high power mode, the control signal H (high) is input to the other end of the choke coil 46, and the PIN diode becomes ON. For this reason, the signal from the coupler 14L is totally reflected at the point "X" and does not reach the diode SD, therefore the detection voltage $V_{det}$ (L) is not obtained.

Figure 6:
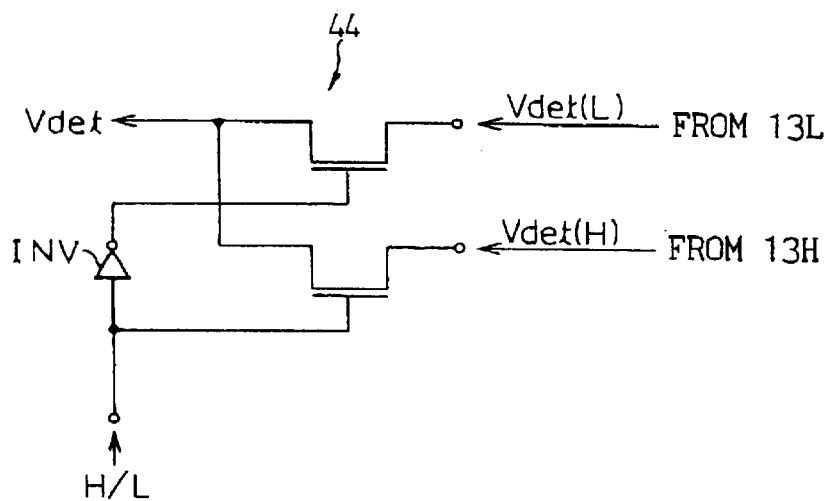
FIG. 6 is a view of a concrete example of a selector 44 of FIG. 3.

FIG. 6 is a view of a concrete example of the selector 44 of FIG. 3. The selector 44 comprises a complementary FET pair. The control signal H/L is applied to one gate thereof via an inverter INV. For example, in the low power mode, the control signal L (low) is applied, the FET on the upper side in the figure becomes ON, and the $V_{det}(L)$ is selected as the detection voltage $V_{det}$ to the ALC circuit 16.

Figure 7:
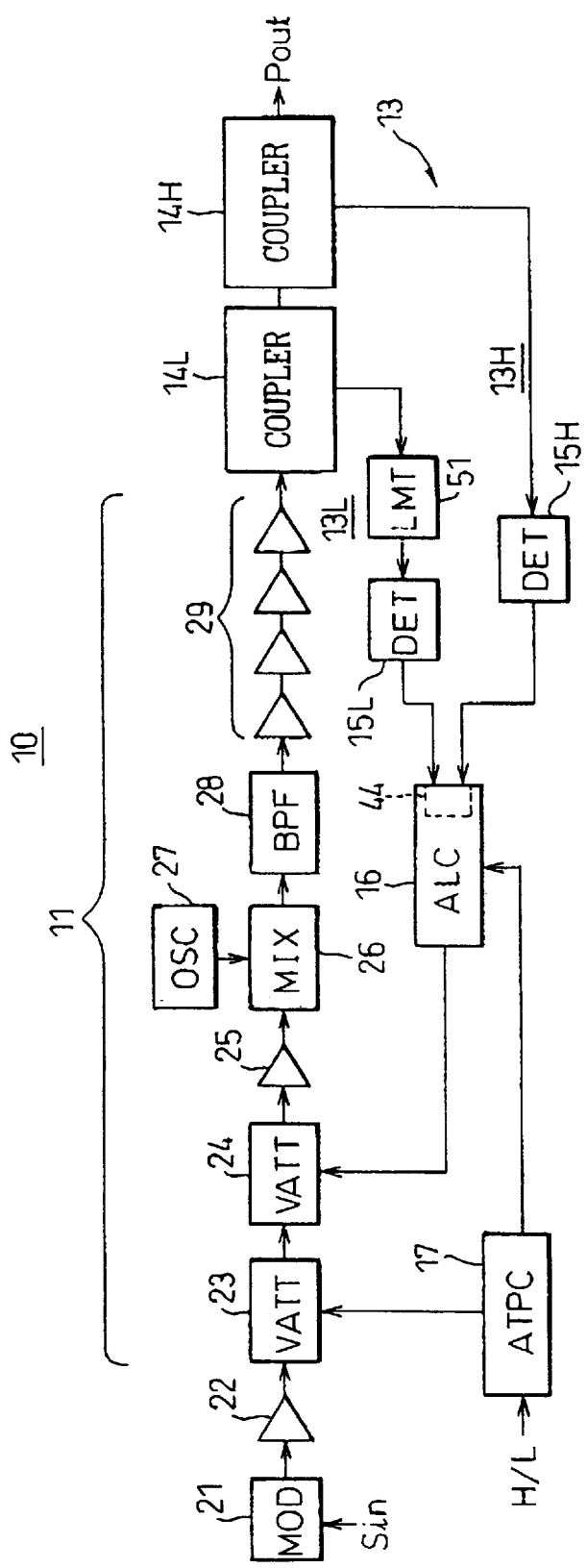
FIG. 7 is a view of a second embodiment based on the present invention.

FIG. 7 is a view of a second embodiment based on the present invention. The first detection unit 13L in this second embodiment is provided with a limiter circuit 51 (LMT) receiving as its input the output from the first coupler 14L and applying the output to the first detector 15L. This limiter circuit 51 has characteristics in that the output is saturated when the input $P_{in}$ from the first coupler 14L is at a high level, while has characteristics in that the output thereof linearly varies along with the input $P_{in}$ when the input $P_{in}$ from the first coupler 14L is at a low level.

The role of this limiter circuit 51 resembles that of the switch 43 in the first embodiment shown in FIG. 3, but is fundamentally different in that the limiter circuit 51 autonomously operates. Namely, the control signal H/L applied to the switch 43 shown in FIG. 5 is unnecessary.

Figure 8:
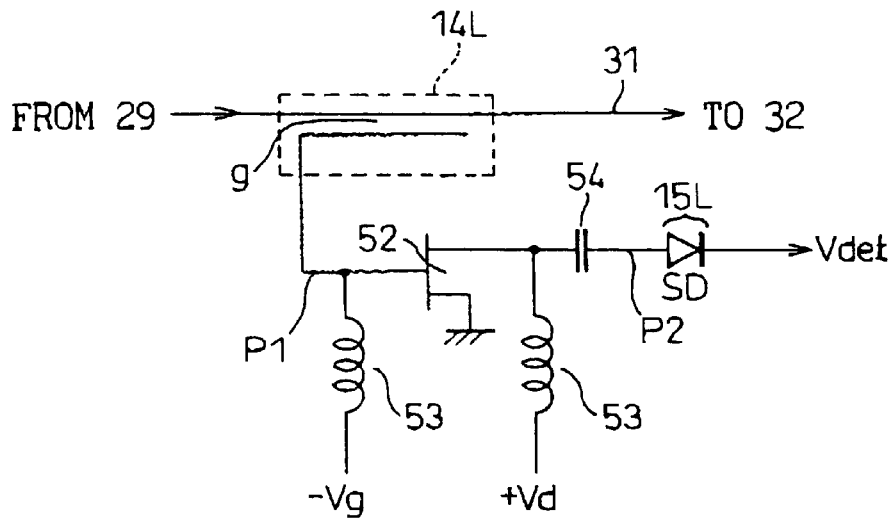
FIG. 8 is a view of a concrete example of a limiter circuit 51.

FIG. 8 is a view of a concrete example of the limiter circuit 51. In the figure, the limiter circuit 51 comprises an FET 52, a choke coil 53 for DC bias, and a DC-cut capacitor 54. The other components were all already mentioned.

This limiter circuit 51 is a so-called FET limiter, but is not limited to this and may be a diode limiter. By this limiter circuit 51, in the low power mode, the input from the coupler 14L is applied to the detector 15L as it is, but in the high power mode, the input from the coupler 14L is suppressed and applied to the detector 15L. This situation is clear from FIG. 9.

Figure 9:
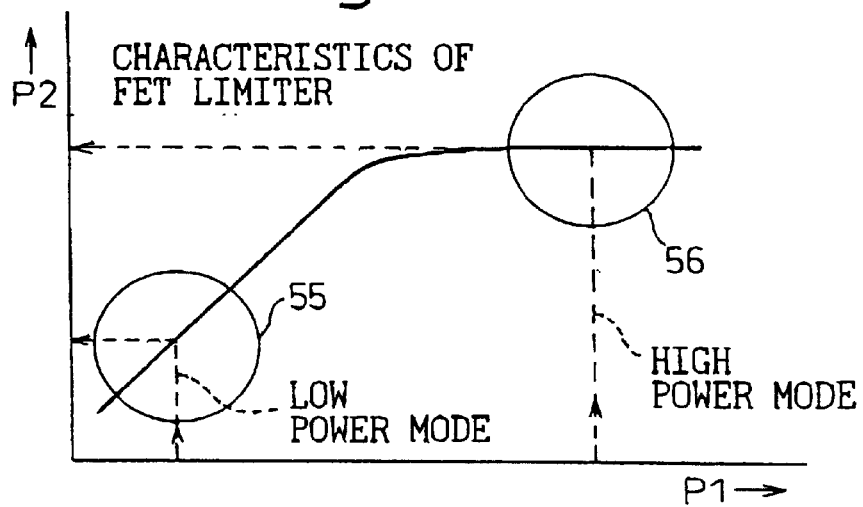
FIG. 9 is a graph of a limiter characteristic of a field effect transmitter (FET) 52 of FIG. 8.

FIG. 9 is a graph of the limiter characteristic of the FET 52 of FIG. 8. P1 of the figure is the input level at the point P1 of FIG. 8 (point at which the input power $P_{in}$ from the coupler 14L appears), and P2 of the figure is the input level at the point P2 of FIG. 8 (input point of the detector 15L).

As shown in FIG. 9, in the low power mode, the characteristic of an active region 55 is shown and the levels P1 and P2 vary with a linear relationship. On the other hand, in the high power mode, the characteristic of an active region 56 is shown and the level P2 is saturated regardless of the level P1. As a result, in the high power mode, the input of a signal of an excessive level to the detector 15L can be prevented, and the diode SD (15L) can be protected.

Note that the selector 44 can also be used in the second embodiment.

Figure 10:
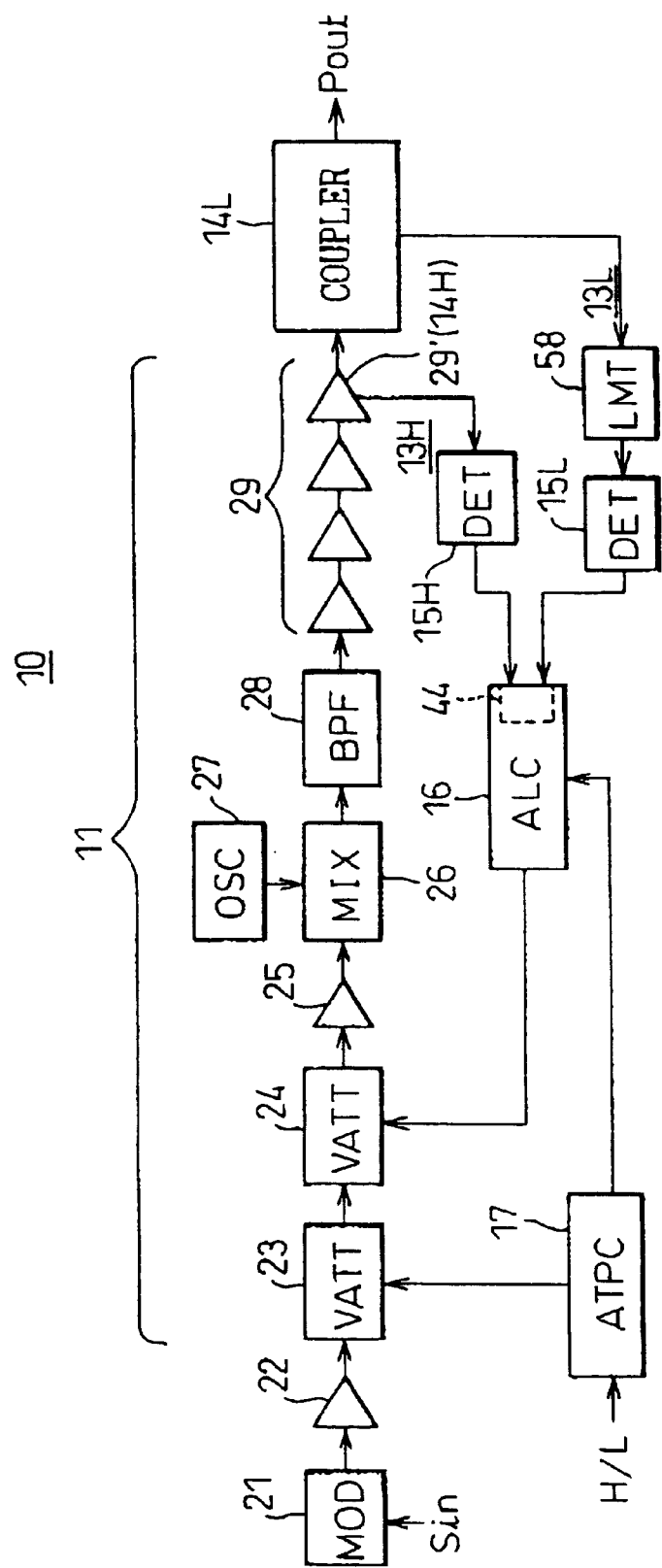
FIG. 10 is a view of a third embodiment based on the present invention.

FIG. 10 is a view of a third embodiment based on the present invention. In this third embodiment, compared with the basic configuration shown in FIG. 1, the arrangements of the first detection unit 13L and the second detection unit 13H are reversed. In addition, the configuration of the second detection unit 13H is different from those of the first and second embodiments. Namely, the second detection unit 13H in the third embodiment utilizes a final stage amplifier 29' of the RF band amplifier group 29. This final stage amplifier 29' is a modification of the second coupler 14H mentioned before.

More concretely, in the third embodiment, the first detection unit 13L comprises the first coupler 14L and the first detector 15L like the cases of the first and second embodiments. On the other hand, the second detection unit 13H comprises a final stage transistor forming the final stage amplifier 29' of the RF band amplifier group 29 constituting the transmission power generating stage 11 and its bias circuit and the second detector 15H receiving as its input the transmission power signal leaked from this bias circuit. Particularly, in the high power mode, attention is paid to the fact that the high transmission output appears in the final stage amplifier 29.

Figure 11:
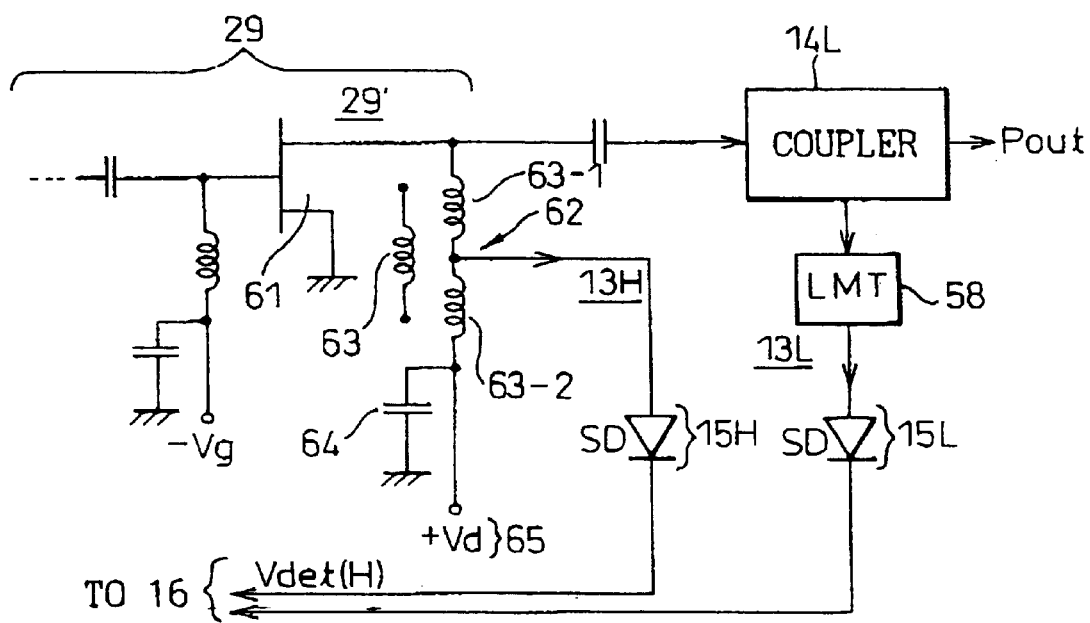
FIG. 11 is a view of a concrete example of a first detection unit 13L and a second detection unit 13H in FIG. 10.

FIG. 11 is a view of a concrete example of the first detection unit 13L and the second detection unit 13H in FIG. 10. In the figure, reference numeral 29 is the already mentioned RF band amplifier group. Its final stage amplifier 29' comprises a final stage transistor 61 and a bias circuit 62. The second detection unit 13H in the third embodiment is characterized in the point that the transmission power signal leaked from this bias circuit 62 is used as the input. This leakage transmission power signal is detected at the second detector 15H and applied to the ALC circuit 16. Note that, also in the first detection unit 13L (14L, 15L), the configuration of connecting the same to the ALC circuit 16 is no different from the case of the already mentioned embodiments. The limiter circuit (LMT) 58 in this detection unit 13L will be mentioned later.

Here, when looking at the leakage transmission power signal used in the second detection unit 13H, the bias circuit 62 producing this signal has a choke coil (63) connected to a bias source $+V_d$. The choke coil (63) is divided into a plurality of sections (63-1 and 63-2) to obtain divided transmission power signals (leakage transmission power signals), and applied to the second detector 15H. A bias circuit 62 usually comprises a single choke coil 63 and a bypass capacitor 64, but in the third embodiment, the choke coil 63 (reactance L) is divided to a plurality of (two in the figure) sections to form L/2 choke coils 63-1 and 63-2. The transmission output is leaked from an intermediate point between them. Even if the choke coil is divided, the reactance L as a whole is not altered and exhibits a sufficiently high impedance with respect to the bias source $(+V_d)$ 65.

On the other hand, the first detection unit 13L in the third embodiment is constituted so as to contain the limiter circuit (LMT) 58 inserted between the first coupler 14L and the first detector 15L. The concrete configuration of this limiter circuit 58 may be the configuration shown in FIG. 8 mentioned before. By this limiter circuit 58, the diode SD (15L) can be protected from the high transmission output in the high power mode. Note that if the coupler 14L is the loosely coupled type, it is also possible to omit the limiter circuit 58.

Figure 12:
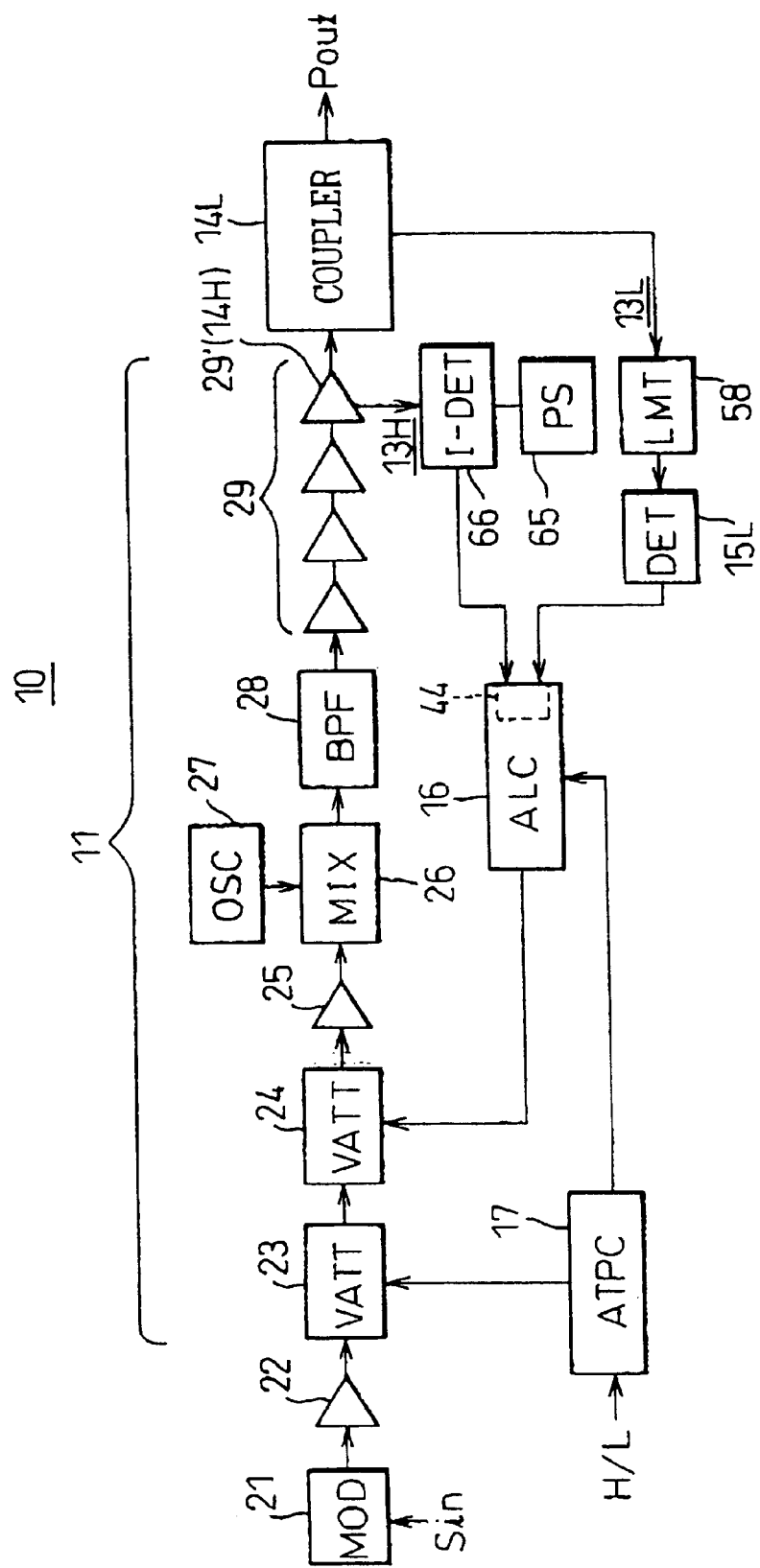
FIG. 12 is a view of a fourth embodiment based on the present invention.

FIG. 12 is a view of a fourth embodiment based on the present invention. The basic concept of this fourth embodiment is the same as the third embodiment in the point that the detection voltage is obtained from the final stage amplifier 29'.

The difference resides in that the third embodiment has a voltage detecting type configuration, but in contrast, this fourth embodiment has a current detecting type configuration. When comparing the second detection units 13H of FIG. 10 and FIG. 12, in FIG. 12, this second detection unit 13H is configured by the current variation detecting circuit (I-DET) 66.

Namely, this fourth embodiment is configured so that the first detection unit 13L comprises the first coupler 14L and the first detector 15L and the second detection unit 13H comprises a current variation detecting unit (I DET) 66 for detecting the amount of the variation of the current, flowing in the final stage transistor 61 forming the final stage amplifier 29' of the RF band amplifier group 29 constituting the transmission power generating stage 11, varying along with the fluctuation of the transmission power $P_{out}$.

Further preferably, the first detection unit 13L contains the limiter circuit (LMT) 58 inserted between the first coupler 14L and the first detector 15L (same as the third embodiment). A concrete example will be shown next.

Figure 13:
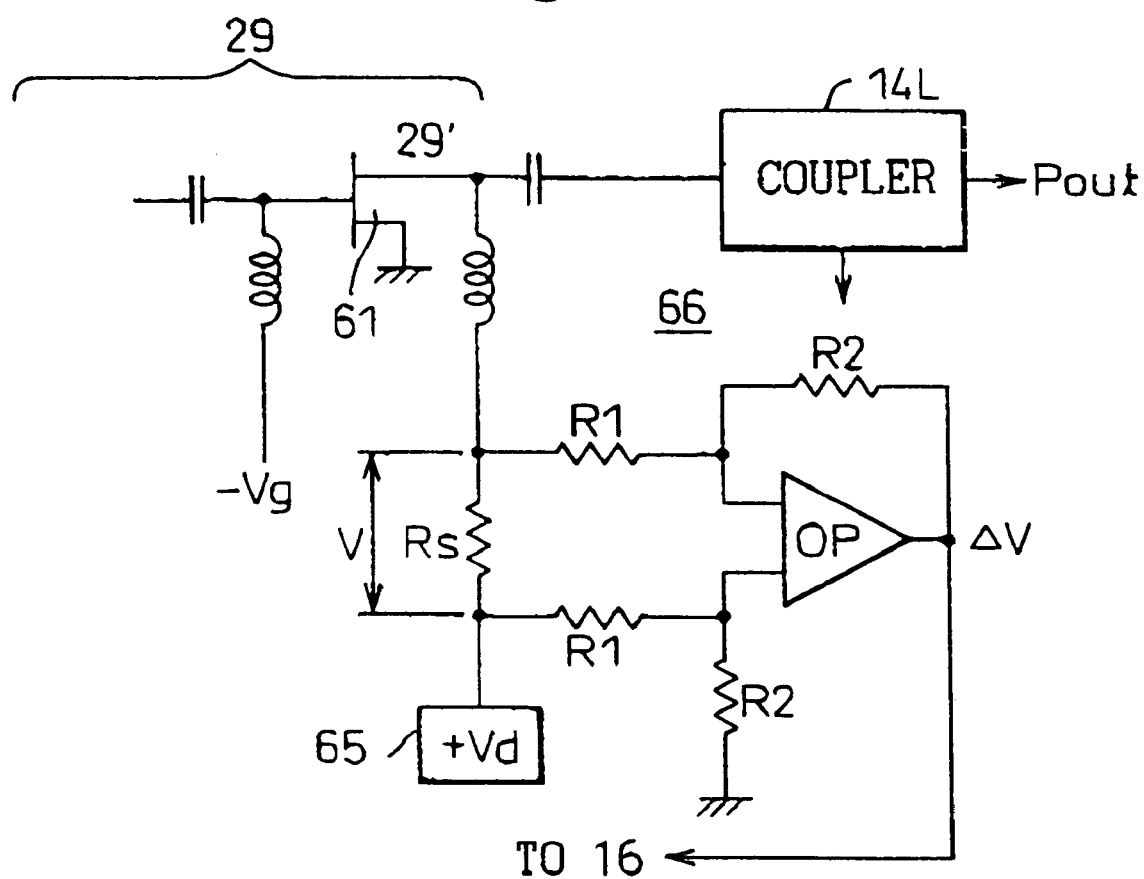
FIG. 13 is a view of a concrete example of a current variation detection circuit 66 in FIG. 12.

FIG. 13 is a view of a concrete example of the current variation detecting circuit 66 in FIG. 12.

In the figure, the current variation detecting unit 66 comprises an operational amplifier OP for detecting the amount of variation as the variation of the voltage (V) across the two ends of a resistor $R_s$ through which the current is passed. The amount of variation ΔV becomes;

$$\Delta V = (R2/R1) \times V$$

where resistance values of resistors on the periphery of the operational amplifier OP are set as shown in the present figure.

Figure 14:
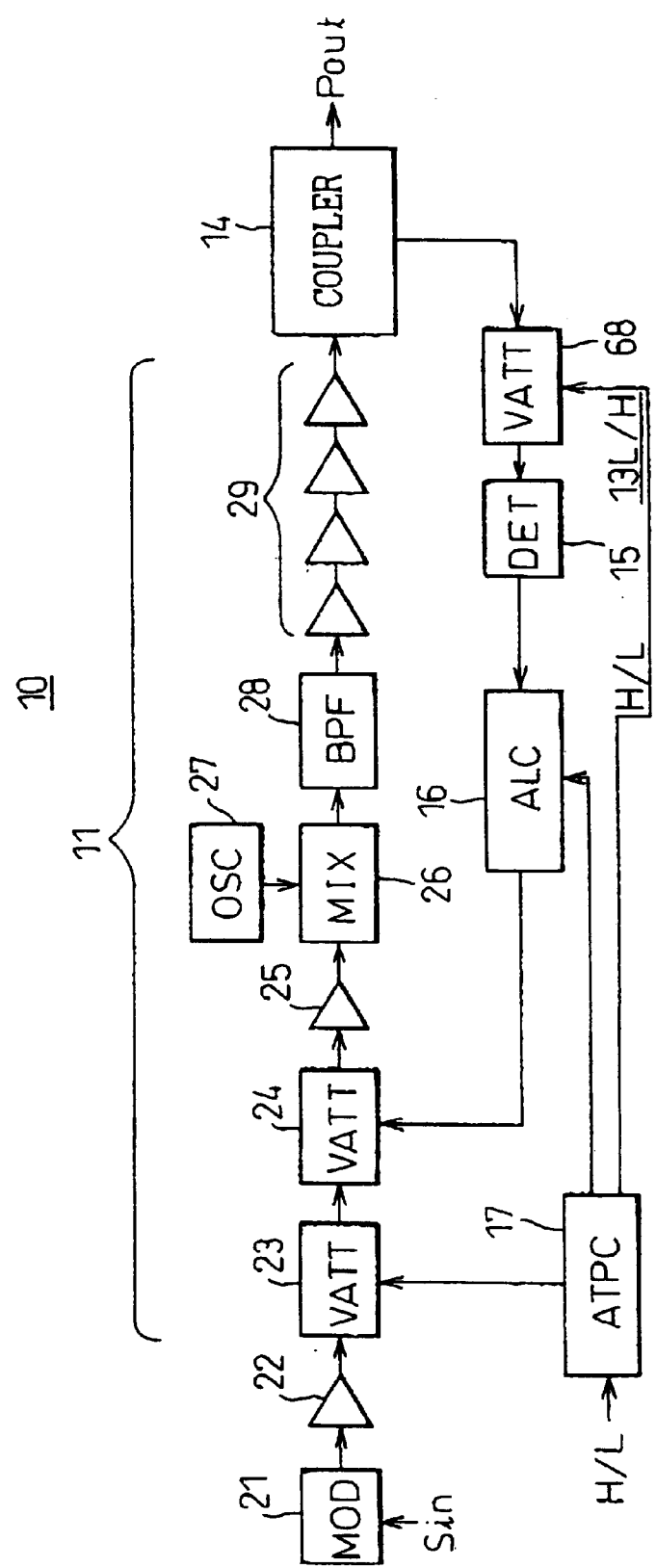
FIG. 14 is a view of a fifth embodiment based on the present invention.

FIG. 14 is a view of a fifth embodiment based on the present invention. In the embodiments explained heretofore, the first detection unit 13L which becomes effective in the low power mode and the second detection unit 13H which becomes effective in the high power mode were assembled by devices physically independent from each other, but this fifth embodiment is characterized in that the first detection unit 13L and the second detection unit 13H are formed integrally.

Namely, in the fifth embodiment, the already mentioned detection unit 13 is configured by a common detection unit 13L/H comprising both the first detection unit 13L which becomes effective in the low power mode and the second detection unit 13H which becomes effective in the high power mode. Here, the common detection unit 13L/H is configured by (i) the coupler 14,
(ii) a variable attenuator (VATT) 68 which gives a small attenuation (or no attenuation) to the output from this coupler 14 in the low power mode, while gives a large attenuation to the output in the high power mode, and
(iii) the detector 15 to which the output of the variable attenuator 68 is applied.

In this case, the amount of attenuation of the variable attenuator 68 is switched according to the control signal H/L. Thus, this fifth embodiment is advantageous in the point of the reduction of the amount of hardware in comparison with the embodiments mentioned before.

Figure 15:
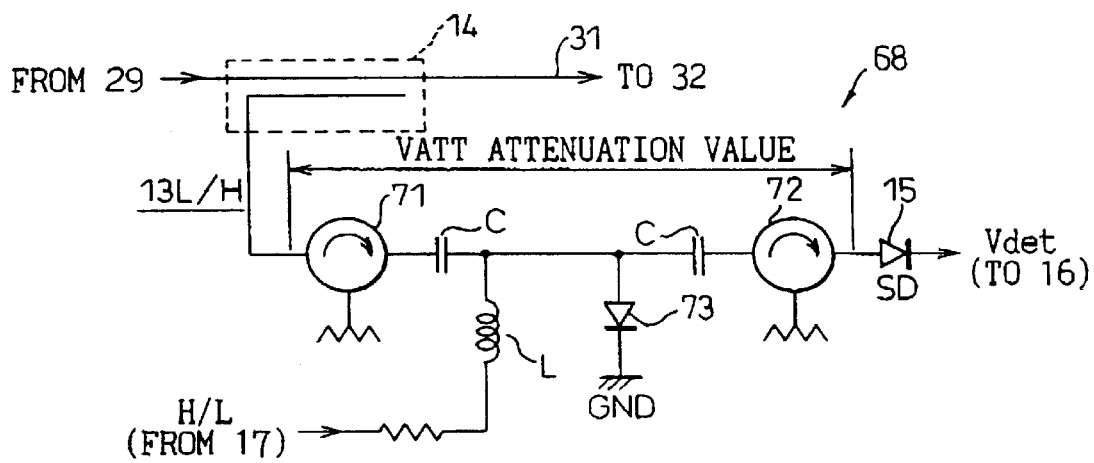
FIG. 15 is a view of a concrete example of a common detection unit 13L/H in FIG. 14.

FIG. 15 is a view of a concrete example of the common detection unit 13L/H in FIG. 14. In the figure, the common detection unit 13L/H comprises the coupler 14, variable attenuator 68, and detector (SD) 15, and the variable attenuator 68 comprises a first isolator 71, a second isolator 72 connected in series therewith, and a PIN diode 73 connected between the intermediate point of these isolators 71 and 72 and a ground GND. C is the DC-cut capacitor, and L is the RF choke.

When the control signal H/L corresponding to the setting information of the high power mode or low power mode is H (high) (high power mode), the PIN diode 73 becomes ON, and a propagating signal is totally reflected there, therefore a large attenuation is given to the input signal to the detector 15. By this, the diode SD forming the detector 15 is protected.

When the control signal H/L is at L (low) (low power mode), the PIN diode becomes OFF, the propagating signal passes through this diode as it is, and only a small attenuation is given to the input signal to the detector 15.

Figure 16:
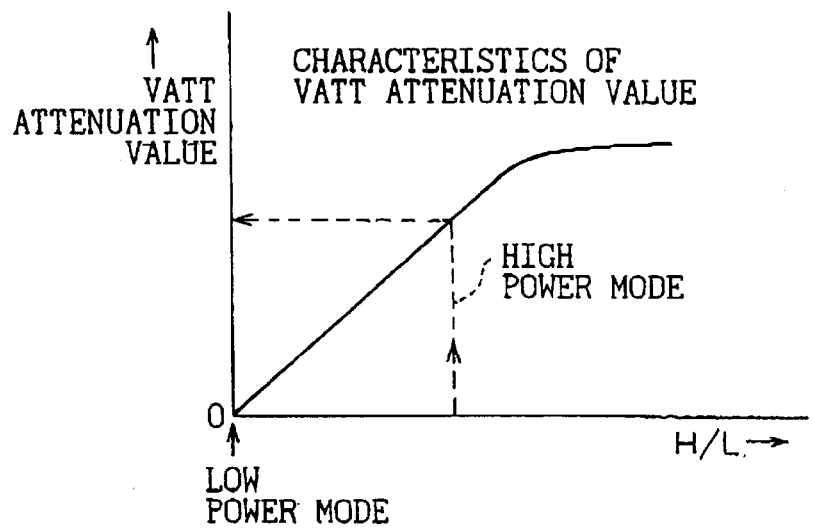
FIG. 16 is a graph of an amount of attenuation of a variable attenuator 68 in FIG. 15.

FIG. 16 is a graph showing the characteristic of the amount of attenuation amount of the variable attenuator 68 in FIG. 15. In the low power mode, the amount of attenuation is 0, but in contrast, in the high power mode, a large amount of attenuation is shown.

As explained above, according to the present invention, a reduction of the power consumption can be achieved by obtaining a sufficiently large level difference of transmission outputs $P_{out}$ in the high power mode and the low power mode set by the ATPC function. In addition, in this case, in both modes, the stable detection voltage necessary for the ALC operation can be obtained and destruction of the diode forming the detector does not occur in the high power mode.

What is claimed is:

1. A radio transmitter apparatus having:
    a transmission power generating stage for performing frequency conversion on, amplifying, and outputting an input signal;
    a detection unit partially branching the output of the transmission power generating stage and outputting a detection voltage;
    an ALC circuit for performing automatic level control (ALC) with respect to said transmission power generating stage according to the detection output from the detection unit; and
    an ATPC unit for performing automatic power control (ATPC) for operating said transmission power generating stage and said ALC circuit in either of a high power mode or a low power mode;
    the detection unit being configured by:
        a first detection unit which becomes effective in said low power mode and
        a second detection unit which becomes effective in said high power mode, wherein,
            said first detection unit comprises a first coupler for said branching with a first degree of coupling and a first detector, and
            said second detection unit comprises a second coupler for said branching with a second degree of coupling and a second detector,
            wherein the first degree of coupling is larger than the second degree of coupling, wherein
                said first detection unit is provided with a limiter circuit receiving as its input the output from said first coupler and applying the output to said first detector, and wherein
                the limiter circuit has characteristics in that the output is saturated when the input from the first coupler is at a high level, while also having characteristics in that the output thereof linearly varies along with the input when the input from the first coupler is at a low level.

2. A radio transmitter apparatus having:
    a transmission power generating stage for performing frequency conversion on, amplifying, and outputting an input signal;
    a detection unit partially branching the output of the transmission power generating stage and outputting a detection voltage;
    an ALC circuit for performing automatic level control (ALC) with respect to said transmission power generating stage according to the detection output from the detection unit; and
    an ATPC unit for performing automatic power control (APTC) for operating said transmission power generating stage and said ALC circuit in either of a high power mode or a low power mode;
    the detection unit being configured by:
        a first detection unit which becomes effective in said low power mode and
        a second detection unit which becomes effective in said high power mode, wherein, said first detection unit comprises a first coupler and a first detector, and said second detection unit comprises a final stage transistor forming a final stage amplifier of an RF band amplifier group constituting said transmission power generating stage and its bias circuit and a second detector receiving as its input the transmission power signal leaked from said bias circuit.

3. A radio transmitter apparatus as set forth in claim 2, wherein said bias circuit has a choke coil connected to a bias source and inputs divided transmission power signals obtained by dividing the choke coil to a plurality of sections to said second detector.

4. A radio transmitter apparatus as set forth in claim 2, wherein said first detection unit contains a limiter circuit inserted between the first coupler and the first detector.

5. A radio transmitter apparatus having:

a transmission power generating stage for performing frequency conversion on, amplifying, and outputting an input signal;

a detection unit partially branching the output of the transmission power generating stage and outputting a detection voltage;

an ALC circuit for performing automatic level control (ALC) with respect to said transmission power generating stage according to the detection output from the detection unit; and an ATPC unit for performing automatic power control (ATPC) for operating said transmission power generating stage and said ALC circuit in either of a high power mode or a low power mode;

the detection unit being configured by:

a first detection unit which becomes effective in said low power mode and a second detection unit which becomes effective in said high power mode, wherein, said first detection unit comprises a first coupler and a first detector, and said second detection unit comprises a current variation detecting unit for detecting an amount of variation of current, flowing in a final stage transistor forming the final stage amplifier of the RF band amplifier group constituting said transmission power generating stage, varying along with fluctuation of said transmission power.

6. A radio transmitter apparatus as set forth in claim 5, wherein said current variation detecting unit comprises an operational amplifier for detecting said amount of variation as the variation of the voltage across the two ends of a resistor through which said current is passed.

7. A radio transmitter apparatus as set forth in claim 5, wherein said first detection unit contains a limiter circuit inserted between the first coupler and the first detector.

8. A radio transmitter apparatus having:

a transmission power generating stage for performing frequency conversion on, amplifying, and outputting an input signal;

a detection unit partially branching the output of the transmission power generating stage and outputting a detection voltage;

an ALC circuit for performing automatic level control (ALC) with respect to said transmission power generating stage according to the detection output from the detection unit; and an ATPC unit for performing automatic power control (ATPC) for operating said transmission power generating stage and said ALC circuit in either of a high power mode or a low power mode; wherein, said detection unit is constituted by a common detection unit integrally constituting a first detection unit which becomes effective in said low power mode and a second detection unit which becomes effective in said high power mode, and the common detection unit is configured by a coupler, a variable attenuator which gives a small attenuation with respect the output from the coupler when said low power mode is set by a control signal output from said ATPC unit, and gives a large attenuation with respect to the output from the coupler when said high power mode is set by said control signal, and a detector to which the output of the variable attenuator is directly applied.

9. A radio transmitter apparatus as set forth in claim 8, wherein said variable attenuator comprises a first isolator, a second isolator connected in series therewith, and a PIN diode connected between an intermediate point of the first and second isolators and a ground and turns on and off the PIN diode by the control signal for setting said high power mode and said low power mode.

* * * * *